(12) United States Patent
Shin et al.

(10) Patent No.: US 6,395,578 B1
(45) Date of Patent: May 28, 2002

(54) SEMICONDUCTOR PACKAGE AND METHOD FOR FABRICATING THE SAME

(75) Inventors: WonSun Shin, Kyungki-do (KR); DoSung Chun, The Kingdom of Thailand (TH); SangHo Lee, Seoul (KR); SeonGoo Lee, Kyungki-do (KR); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/574,541

(22) Filed: May 19, 2000

(30) Foreign Application Priority Data

May 20, 1999 (KR) ........................................ 1999-18244
Sep. 7, 1999 (KR) ........................................ 1999-37925
Sep. 7, 1999 (KR) ........................................ 1999-37928

(51) Int. Cl.$^7$ ......................... H01L 21/44; H01L 21/48; H01L 21/50

(52) U.S. Cl. ...................... 438/106; 438/108; 438/123; 438/613; 438/615; 438/617

(58) Field of Search ................................ 438/615, 617, 438/613, 612, 127, 26, 64, 55, 123, 112, 124, 126, 106, 107, 121, 113, 108, 118, 110, 125; 257/710, 697, 787, 700, 783

(56) References Cited

U.S. PATENT DOCUMENTS 3,851,221 A    11/1974   Beaulieu et al. ............. 317/100
4,530,152 A    7/1985    Roche et al. .................. 29/588

(List continued on next page.)

FOREIGN PATENT DOCUMENTS

| EP | 503 201 A2 | 12/1991 | ......... H01L/23/495 |
|---|---|---|---|
| JP | 54-128274 | 4/1979 | ......... H01L/23/30 |
| JP | 56-062351 | 5/1981 | ......... H01L/25/04 |
| JP | 60-182731 | 9/1985 | ......... H01L/21/60 |
| JP | 61-059862 | 3/1986 | ......... H01L/25/04 |
| JP | 61-117858 | 6/1986 | ......... H01L/25/08 |
| JP | 62-119952 | 6/1987 | ......... H01L/25/04 |
| JP | 62-126661 | 6/1987 | ......... H01L/25/04 |
| JP | 62-142341 | 6/1987 | ......... H01L/25/04 |
| JP | 63-128736 | 6/1988 | ......... H01L/23/04 |
| JP | 63-211663 | 9/1988 | ......... H01L/25/08 |
| JP | 63-244654 | 10/1988 | ......... H01L/23/28 |
| JP | 10-28856 | 1/1989 | ......... H01L/27/00 |

(List continued on next page.)

*Primary Examiner*—Charles Bowers
*Assistant Examiner*—Chuong Anh Luu

(57) ABSTRACT

Semiconductor packages having a thin structure capable of easily discharging heat from a semiconductor chip included therein, and methods for fabricating such semiconductor packages, are disclosed. An embodiment of a semiconductor package includes a semiconductor chip having a first major surface and a second major surface, the semiconductor chip being provided at the second major surface with a plurality of input/output pads; a circuit board including a resin substrate having a first major surface and a second major surface, a first circuit pattern formed at the first major surface and provided with a plurality of ball lands, a second circuit pattern formed at the second major surface and provided with a plurality of bond fingers connected with he ball lands by conductive via holes through the resin substrate, cover coats respectively coating the first and second circuit patterns while allowing the bond fingers and the ball lands to be exposed therethrough, and a central through hole adapted to receive the semiconductor chip therein; electrical conductors that electrically connect the input/output pads of the semiconductor chip with the bond fingers of the circuit board, respectively; a resin encapsulate that covers the semiconductor chip, the electrical conductors, and at least part of the circuit board; and, a plurality of conductive balls fused on the ball lands of the circuit board, respectively.

35 Claims, 15 Drawing Sheets

U.S. PATENT DOCUMENTS

| | | | |
|---|---|---|---|
| 4,567,643 A | 2/1986 | Droguet et al. | 29/575 |
| 4,707,724 A | 11/1987 | Suzuki et al. | 387/71 |
| 4,730,232 A | 3/1988 | Lindberg | 361/381 |
| 4,756,080 A | 7/1988 | Thorp, Jr. et al. | 29/827 |
| 4,763,188 A | 8/1988 | Johnson | 357/74 |
| 4,982,265 A | 1/1991 | Watanabe et al. | 357/75 |
| 4,996,587 A | 2/1991 | Hinrichsmeyer et al. | 357/74 |
| 5,012,323 A | 4/1991 | Farnworth | 357/75 |
| 5,025,306 A | 6/1991 | Johnson et al. | 357/75 |
| 5,040,052 A | 8/1991 | McDavid | 357/80 |
| 5,138,438 A | 8/1992 | Masayuki et al. | 357/75 |
| 5,140,404 A | 8/1992 | Fogal et al. | 357/70 |
| 5,157,480 A | 10/1992 | McShane et al. | 387/74 |
| 5,165,067 A | 11/1992 | Wakefield et al. | 257/783 |
| 5,198,888 A | 3/1993 | Sugano et al. | 257/686 |
| 5,200,362 A | 4/1993 | Lin et al. | 437/207 |
| 5,229,647 A | 7/1993 | Gnadinger | 257/785 |
| 5,273,938 A | 12/1993 | Lin et al. | 437/207 |
| 5,291,061 A | 3/1994 | Ball | 257/686 |
| 5,323,060 A | 6/1994 | Fogal, et al. | 257/777 |
| 5,334,875 A | 8/1994 | Sugano et al. | 257/686 |
| 5,347,429 A | 9/1994 | Kohno et al. | 361/813 |
| 5,422,435 A | 6/1995 | Takiar et al. | 174/52.4 |
| 5,426,563 A | 6/1995 | Moresco et al. | 361/689 |
| 5,432,729 A | 7/1995 | Carson et al. | 365/63 |
| 5,463,253 A | 10/1995 | Waki et al. | 257/724 |
| 5,473,196 A | 12/1995 | De Givry | 257/786 |
| 5,474,958 A | 12/1995 | Djennas et al. | 437/211 |
| 5,495,394 A | 2/1996 | Kornfeld et al. | 361/764 |
| 5,495,398 A | 2/1996 | Takiar et al. | 361/790 |
| 5,502,289 A | 3/1996 | Takiar et al. | 174/266 |
| 5,514,907 A | 5/1996 | Moshayedi | 257/723 |
| 5,569,625 A | 10/1996 | Yoneda et al. | 29/827 |
| 5,581,498 A | 12/1996 | Ludwig et al. | 365/63 |
| 5,587,341 A | 12/1996 | Masayuki et al. | 437/206 |
| 5,604,376 A | 2/1997 | Hamburgen et al. | 257/676 |
| 5,614,766 A | 3/1997 | Takasu et al. | 257/777 |
| 5,620,928 A | 4/1997 | Lee et al. | 438/118 |
| 5,637,536 A | 6/1997 | Val | 438/686 |
| 5,637,912 A | 6/1997 | Cockerill et al. | 257/620 |
| 5,640,047 A * | 6/1997 | Nakashima | 257/738 |
| 5,682,062 A | 10/1997 | Gaul | 257/686 |
| 5,689,135 A | 11/1997 | Ball | 257/676 |
| 5,696,031 A | 12/1997 | Wark | 437/209 |
| 5,715,147 A | 2/1998 | Nagano | 361/813 |
| 5,721,452 A | 2/1998 | Fogal et al. | 257/685 |
| 5,739,581 A | 4/1998 | Chillara et al. | 257/668 |
| 5,783,870 A | 7/1998 | Mostafazadeh et al. | 257/791 |
| 5,793,108 A | 8/1998 | Nakahishi et al. | 257/723 |
| 5,798,014 A | 8/1998 | Weber | 156/263 |
| 5,815,372 A | 9/1998 | Gallas | 361/760 |
| 5,835,355 A | 11/1998 | Dordi | 361/760 |
| 5,859,471 A | 1/1999 | Kuraishi et al. | 257/666 |
| 5,861,666 A | 1/1999 | Bellaar | 257/686 |
| 5,872,025 A | 2/1999 | Cronin et al. | 438/109 |
| 5,885,849 A | 3/1999 | DiStefano et al. | 438/108 |
| 5,886,412 A | 3/1999 | Fogal et al. | 257/777 |
| 5,894,108 A | 4/1999 | Mostafazadeh et al. | 174/52.4 |
| 5,903,052 A | 5/1999 | Chen et al. | 257/706 |
| 5,909,633 A * | 6/1999 | Haji et al. | 438/612 |
| 5,917,242 A | 6/1999 | Ball | 257/737 |
| 5,930,599 A * | 7/1999 | Fujimoto et al. | 438/113 |
| 5,952,611 A | 9/1999 | Eng et al. | 174/52.4 |
| 5,973,403 A | 10/1999 | Wark | 257/777 |
| 6,005,778 A | 12/1999 | Spielberger et al. | 361/770 |
| 6,013,948 A | 1/2000 | Akram et al. | 257/698 |
| RE36,613 E | 3/2000 | Ball | 257/777 |
| 6,034,423 A | 3/2000 | Mostafazadeh et al. | 257/691 |
| 6,034,427 A | 3/2000 | Lan et al. | 257/698 |
| 6,051,886 A | 4/2000 | Fogal et al. | 257/777 |
| 6,057,598 A | 5/2000 | Payne et al. | 257/723 |
| 6,072,243 A | 6/2000 | Nakanishi | 257/783 |
| 6,074,898 A * | 6/2000 | Ohsawa et al. | 438/123 |
| 6,080,264 A | 6/2000 | Ball | 156/292 |
| 6,093,970 A * | 7/2000 | Ohsawa et al. | 257/777 |
| 6,127,833 A | 10/2000 | Wu et al. | 324/755 |
| 6,133,637 A | 10/2000 | Hikita, et al. | 257/777 |
| 6,172,419 B1 | 1/2001 | Kinsman | 257/737 |
| 6,184,463 B1 | 2/2001 | Panchou et al. | 174/52.4 |
| 6,214,641 B1 | 4/2001 | Akram | 438/107 |
| 6,228,676 B1 * | 5/2001 | Glenn et al. | 438/107 |
| 6,235,554 B1 | 5/2001 | Akram et al. | 438/109 |
| 6,242,279 B1 * | 6/2001 | Ho et al. | 438/106 |
| 6,258,632 B1 * | 7/2001 | Takebe | 438/127 |
| 6,261,869 B1 * | 7/2001 | Radford et al. | 438/123 |
| 6,268,568 B1 * | 7/2001 | Kim | 174/250 |
| 6,271,057 B1 * | 8/2001 | Lee et al. | 438/106 |
| 6,274,404 B1 * | 8/2001 | Hirasawa et al. | 438/107 |
| 6,277,672 B1 * | 8/2001 | Ho | 438/121 |

FOREIGN PATENT DOCUMENTS

| | | | | |
|---|---|---|---|---|
| JP | 64-001269 | | 1/1989 | H01L/25/04 |
| JP | 1-071162 A | | 3/1989 | H01L/23/52 |
| JP | 10-99248 A | | 4/1989 | H01L/25/08 |
| JP | 3-169062 | | 7/1991 | H01L/25/065 |
| JP | 4-028260 | | 1/1992 | H01L/25/065 |
| JP | 4-56262 | | 2/1992 | H01L/25/65 |
| JP | 4-056262 | | 2/1992 | H01L/25/065 |
| JP | 4-096358 | | 3/1992 | H01L/25/065 |
| JP | 4-116859 | | 4/1992 | H01L/25/065 |
| JP | 4-368154 A | | 12/1992 | H01L/23/00 |
| JP | 4-368167 | | 12/1992 | H01L/23/065 |
| JP | 5-0136656 | | 1/1993 | H01L/25/065 |
| JP | 5-75015 A | | 3/1993 | H01L/25/065 |
| JP | 5-109975 | | 4/1993 | H01L/25/065 |
| JP | 5-136323 | | 6/1993 | H01L/23/50 |
| JP | 5-283601 | | 10/1993 | H01L/23/52 |
| JP | 06120364 | * | 4/1994 | 23/10 |
| JP | 06151645 | * | 5/1994 | 23/28 |
| JP | 06163751 | * | 6/1994 | 23/29 |
| JP | 10-256470 | | 9/1998 | H01L/25/065 |

* cited by examiner

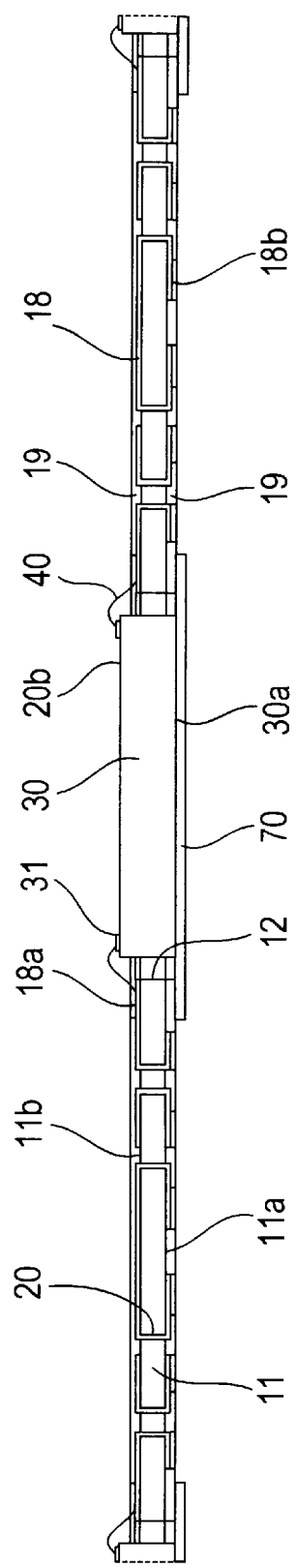

SEMICONDUCTOR PACKAGE AND METHOD FOR FABRICATING THE SAME

BACKGROUND OF THE INVENTION

I. Field of the Invention

The present invention relates to a semiconductor package and a method for fabricating the semiconductor package.

II. Description of the Prior Art

Recently, semiconductor devices have been developed to have a thinner and more miniature structure. For such semiconductor devices, there are ball grid array (BGA) semiconductor packages, chip scale semiconductor packages, and micro BGA semiconductor packages.

Also, semiconductor chips, which are mounted on semiconductor packages as mentioned above, have been developed toward a high performance of electric power circuits, an increase in operating frequency, and an expansion of circuit functions, in pace with the development of integration techniques and manufacturing equipment. For this reason, an increase in heat occurs inevitably during the operation of such a semiconductor chip.

Referring to FIG. 10, a typical BGA semiconductor package having a conventional structure involving the above mentioned problem is illustrated.

As shown in FIG. 10, the BGA semiconductor package, which is denoted by the reference numeral 100', includes a semiconductor chip 1' arranged at a central portion of the semiconductor package 100'. The semiconductor chip 1' is provided with a plurality of integrated electronic circuits. A plurality of input/output pads 2' are provided at an upper surface of the semiconductor chip 1'. A circuit board 10' is bonded at a central portion thereof to a lower surface of the semiconductor chip 1' by means of an adhesive 3'.

The circuit board 10' includes a resin substrate 15'. A circuit pattern 12' provided with bond fingers 11' is formed on an upper surface of the resin substrate 15' around the semiconductor chip 1'. Another circuit pattern provided with a plurality of ball lands 13' is formed on a lower surface of the resin substrate 15'. Each of the circuit patterns is comprised of a thin film made of a conductive material such as copper (Cu). These circuit patterns are interconnected together by via holes 14'. The exposed surface portions of the circuit patterns not covered with the bond fingers 11' and ball lands 13' are coated with cover coats 16', respectively, so that those circuit patterns are protected from the external environment.

The input/output pads 2' of the semiconductor chip 1' are connected to the bond fingers 11' on the upper surface of the circuit board 10' by means of conductive wires 4', respectively. In order to protect the conductive wires 4' from the external environment, the upper surface of the circuit board 10' is encapsulated by a resin encapsulate 20'.

The circuit board 10' is mounted on a mother board (not shown) in a state in which a plurality of conductive balls 40' are fused on the ball lands 13', respectively, so that it serves as a medium for electrical signals between the semiconductor chip 1' and mother board.

In the BGA semiconductor package 100' having the above mentioned configuration, the semiconductor chip 1' thereof exchanges electrical signals with the mother board via the input/output pads 2', conductive wires 4', bond fingers 11', via holes 14', ball lands 13', and conductive balls 40', respectively.

However, the above mentioned conventional BGA semiconductor package is problematic in that it has an increased thickness because the semiconductor chip is bonded to the upper surface of the circuit board having a relatively large thickness. This is contrary to the recent trend toward a miniaturization and thinness. As a result, the above mentioned semiconductor package is problematic in that it cannot be applied to a variety of miniature electronic appliances such as portable phones, cellular phones, pagers, and notebooks.

Furthermore, in spite of the increasing heat generated at the semiconductor chip, as mentioned above, there is no appropriate heat discharge means in the conventional semiconductor package. As a result, the conventional semiconductor package is implicated in a heat-related degradation in the electrical performance and other functions of the semiconductor chip. In severe cases, the semiconductor package and the electronic appliance using it may be so damaged as not to be inoperable.

Although a semiconductor package has been proposed, which is provided with a heat discharge plate or heat sink for easily discharging heat generated from the semiconductor chip, the provision of such a heat discharge plate causes another problem because it serves to further increase the thickness of the semiconductor package while increasing the manufacturing costs.

SUMMARY OF THE INVENTION

Therefore, the present invention has been made in view of the above mentioned problems involved in the prior art, and an object of the invention is to provide a semiconductor package having a super-thin structure and a method for fabricating the semiconductor package.

Another object of the invention is to provide a semiconductor package having a structure capable of easily discharging heat from a semiconductor chip included therein, and a method for fabricating the semiconductor package.

In accordance with one aspect, the present invention provides a semiconductor package comprising: a semiconductor chip having a first major surface and a second major surface, the semiconductor chip being provided at the second major surface with a plurality of input/output pads; a circuit board including a resin substrate having a first major surface and a second major surface, a first circuit pattern formed at the first major surface and provided with a plurality of ball lands, a second circuit pattern formed at the second major surface and provided with a plurality of bond fingers connected with the ball lands by conductive via holes, cover coats respectively coating the first and second circuit patterns while allowing the bond fingers and the ball lands to be open, and a central through hole adapted to receive the semiconductor chip therein; electrical connection means for electrically connecting the input/output pads of the semiconductor chip with the bond fingers of the circuit board, respectively; a resin encapsulate for encapsulating the semiconductor chip, the electrical connection means, and the circuit board; and a plurality of conductive balls fused on the ball lands of the circuit board, respectively.

The semiconductor chip may be arranged in such a fashion that it is oriented, at the second major surface thereof, in the same direction as the second major surface of the circuit board provided with the bond fingers while being flush, at the first major surface thereof, with the first major surface of the circuit board provided with the ball lands and one surface of the resin encapsulate.

The resin encapsulate may be formed to completely or partially encapsulate the second major surface of the circuit board provided with the bond fingers.

The second major surface of the circuit board provided with the bond fingers may be further provided with a plurality of ball lands.

A plurality of conductive balls may be fused on the ball lands provided at the second major surface of the circuit board, respectively.

The semiconductor package may further comprises a closure member attached to the first major surface of the semiconductor chip and adapted to cover the through hole of the circuit board.

Preferably, each of the closure members comprises an insulating tape or a copper layer.

In accordance with another aspect, the present invention provides a method for fabricating semiconductor packages comprising the steps of: preparing a circuit board strip including a plurality of unit circuit boards, the circuit board strip having a plurality of ball lands formed at a first major surface thereof, a plurality of bond fingers formed at a second major surface thereof and respectively connected with the ball lands by conductive via holes, and a plurality of through holes respectively associated with the unit circuit boards; receiving, in the through holes, semiconductor chips each having a first major surface and a second major surface provided with a plurality of input/output pads, respectively; electrically connecting the input/output pads of the semiconductor chips with associated ones of the bond fingers of the circuit board strip using connection means, respectively; encapsulating the semiconductor chips, the connection means, and the through holes of the circuit board strip using an encapsulating material; fusing conductive balls on the ball lands of the circuit board strip; and singulating the circuit board strip into semiconductor packages respectively corresponding to the unit circuit boards.

The circuit board strip prepared at the circuit board strip preparing step may comprise: a main strip including a resin substrate having a substantially rectangular strip shape provided with a first major surface and a second major surface; a plurality of main slots extending to a desired length in a direction transverse to a longitudinal direction of the main strip while being uniformly spaced apart from one another in the longitudinal direction of the main strip, thereby dividing the main strip into a plurality of sub-strips aligned together in the longitudinal direction of the main strip; a plurality of sub slots extending to a desired length and serving to divide each of the sub-strips into a plurality of strip portions arranged in a matrix array, each of the strip portions corresponding to one of the unit circuit boards while having one of the through holes; a plurality of first circuit patterns each formed on the first major surface of the resin substrate for an associated one of the strip portions and provided with associated ones of the ball lands; a plurality of second circuit patterns each formed on the second major surface of the resin substrate for an associated one of the strip portions and provided with associated ones of the bond fingers; and cover coats respectively coated over the first and second major surfaces of the resin substrate while allowing the bond fingers and the ball lands to be externally open.

Alternatively, the circuit board strip prepared at the circuit board strip preparing step may comprise: a resin substrate having a substantially rectangular strip shape provided with a first major surface and a second major surface; a plurality of slots extending to a desired length and serving to divide each of the resin substrate into a plurality of substrate portions arranged in a matrix array, each of the substrate portions corresponding to one of the unit circuit boards while having one of the through holes; a plurality of first circuit patterns each formed on the first major surface of the resin substrate for an associated one of the strip portions and provided with associated ones of the ball lands; a plurality of second circuit patterns each formed on the second major surface of the resin substrate for an associated one of the strip portions and provided with associated ones of the bond fingers; and cover coats respectively coated over the first and second major surfaces of the resin substrate while allowing the bond fingers and the ball lands to be externally open.

The method may further comprise the step of attaching a plurality of closure members to the first major surface of the circuit board strip in such a fashion that each of the closure members covers an associated one of the through holes, prior to the step of receiving the semiconductor chips in the through holes.

The method may further comprise the step of attaching a plurality of closure members to the first major surface of the main strip in such a fashion that each of the closure members covers an associated one of the through holes, prior to the step of receiving the semiconductor chips in the through holes.

The closure member attaching step may comprise the steps of preparing closure member strips each having closure members for an associated one of the sub-strips, and individually attaching the closure member strips to the sub-strips, respectively, in such a fashion that each of the closure member strips is arranged to cover the main slot formed at one side of an associated one of the sub-strips.

Alternatively, the closure member attaching step may comprise the steps of preparing a single closure member strip having closure members for all sub-strips of the circuit board strip while having small singulation apertures at a region corresponding to each of the main slots, and attaching the closure member strip to the main strip in such a fashion that the closure member strip is arranged to allow each of the small singulation apertures to be aligned with an associated one of the main slots.

The closure members are removed after the encapsulating step, e.g., before or after the conductive ball fusing step, or after the singulation step.

The closure members may be removed by inserting a planar bar into each of the main slots in a direction from the second major surface of the circuit board strip to the first major surface of the second board strip, thereby detaching an associated one of the closure members from the circuit board strip at one side of the associated closure member.

Each of the closure members may comprise an insulating tape, an ultraviolet tape, or a copper layer.

The encapsulating step may be carried out to form an encapsulate completely encapsulating the second major surface of the circuit board strip.

The singulation step may be carried out in such a fashion that the encapsulate and the circuit board strip are simultaneously singulated.

The encapsulating step may comprise the steps of interposing the circuit board strip between a pair of molds, one of which has cavities and gates, in such a fashion that the second major surface of each of the semiconductor chips faces an associated one of the cavities while facing an associated one of the gates at a central portion thereof, and injecting the encapsulating material into each of the cavities through an associated one of the gates in such a fashion that it flows outwardly from the central portion of the second major surface of the associated semiconductor chip along the second major surface.

The circuit board strip prepared at the circuit board strip preparing step may be further provided with a plurality of ball lands at the second major surface thereof having the bond fingers. In this case, the conductive ball fusing step further comprises the step of fusing a plurality of conductive balls on the ball lands provided at the second major surface of the circuit board strip having the bond fingers.

In accordance with the present invention, a circuit board is used which has a through hole of a desired size adapted to receive a semiconductor chip, thereby allowing the thickness of the semiconductor chip to be offset by the thickness of the circuit board. Accordingly, it is possible to fabricate semiconductor packages having a super-thin structure.

In accordance with the present invention, the semiconductor chip is outwardly exposed at one major surface thereof without being encapsulated by an encapsulate. Accordingly, heat generated from the semiconductor chip can be easily discharged into the atmosphere. This results in an improvement in the thermal and electrical performance of the semiconductor chip.

In accordance with the present invention, the circuit board may be completely encapsulated at one major surface thereof by an encapsulate. In this case, it is possible to effectively prevent a bending phenomenon of the circuit board.

In addition, the use of closure members during the fabrication of semiconductor packages according to the present invention achieves an easy encapsulating process.

For such closure members, closure member strips may be used, each of which has closure members for one sub strip of a circuit board strip. In this case, the closure member strips are individually attached to the sub-strips of the circuit board strip. Alternatively, a single closure member strip may be used which has closure members for all sub-strips of the circuit board strip while having small singulation apertures or slits. By virtue of such a single closure member strip or closure member strips, an easy removal of closure members is achieved.

Also, the encapsulating process involved in the fabrication of semiconductor packages is conducted in such a fashion that it proceeds from the second major surface of each semiconductor chip in accordance with the present invention. Accordingly, it is possible to achieve a uniform encapsulation while suppressing the occurrence of a wire sweeping phenomenon.

BRIEF DESCRIPTION OF THE DRAWINGS

The above objects, and other features and advantages of the present invention will become more apparent after a reading of the following detailed description when taken in conjunction with the drawings, in which:

FIGS. 7A to 7F are cross-sectional views respectively illustrating stages in a semiconductor package fabricating method according to the present invention;

DESCRIPTION OF THE EXEMPLARY EMBODIMENTS

Referring to FIGS. 1 to 5, semiconductor packages according to various embodiments of the present invention are illustrated, respectively.

Figure 1:
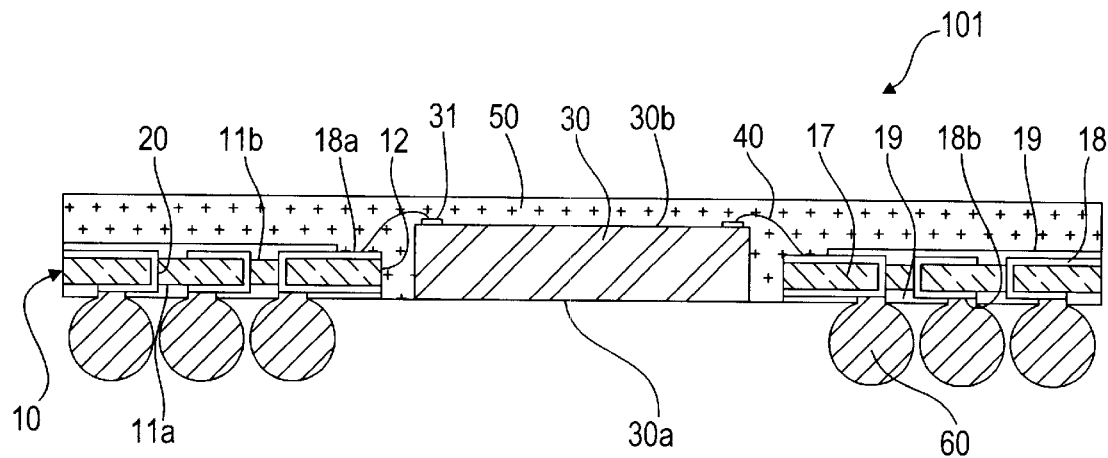
FIGS. 1 to 5 are cross-sectional views respectively illustrating semiconductor packages according to various exemplary embodiments of the present invention.

In accordance with the embodiment of the present invention illustrated in FIG. 1, the semiconductor package, which is denoted by the reference numeral 101, includes a semiconductor chip 30 having a first major surface 30a (a lower surface in FIG. 1) and a second major surface 30b (an upper surface in FIG. 1). A plurality of input/output pads 31 are formed at the second major surface 30b of the semiconductor chip 30.

The semiconductor chip 30 is arranged in such a fashion that it is received in a through hole 12 formed 10 through a circuit board 10 to have a desired size. The through hole 12 has a size larger than the area of the first or second surface 30a or 30b of the semiconductor chip 30. The circuit board 10 includes a resin substrate 17 having a first major surface 11a (a lower surface in FIG. 1) and a second major surface 11b (an upper surface in FIG. 1). The through hole 12 is centrally formed through the resin substrate 17. The resin substrate 17 is provided at the first major surface 11a thereof with a conductive circuit pattern 18 having a plurality of ball lands 18b. The conductive circuit pattern 18 is arranged around the through hole 12. The resin substrate 17 is also provided at the second major surface 11b thereof with another conductive circuit pattern 18 having a plurality of bond fingers 18a. The conductive circuit patterns 18 on the first and second major surfaces of the circuit board 10 are electrically connected to each other by conductive via holes 20.

Each of the bond fingers 18a is plated with gold (Au) or silver (Ag) in order to allow an easy bonding of a conductive connecting means 40 (e.g., a bond wire) thereto. 30 Each of the ball lands 18b is plated with gold (Au), silver (Ag), nickel (Ni), or palladium (Pd) in order to allow an easy bonding of a conductive ball 60 thereto. Preferably, the resin substrate 17 is made of a bismaleimide triazine (BT) epoxy resin exhibiting a hardness. Of course, the resin substrate 17 is not limited to the above mentioned material.

The conductive circuit patterns 18 are coated with cover coats 19 in such a fashion that the bond fingers 18a and ball lands 18b are externally open through the cover coats 19, respectively, so that they are protected from physical, chemical, electrical, and mechanical damage externally applied thereto.

The input/output pads 31 of the semiconductor chip 30 are electrically interconnected with the bond fingers 18a on the circuit board 10 via the conductive connecting means 40, respectively. The conductive connecting means 40 may comprise conductive wires, such as gold (Au) wires or aluminum (Al) wires, or leads extending from respective bond fingers 18a.

Figure 2:
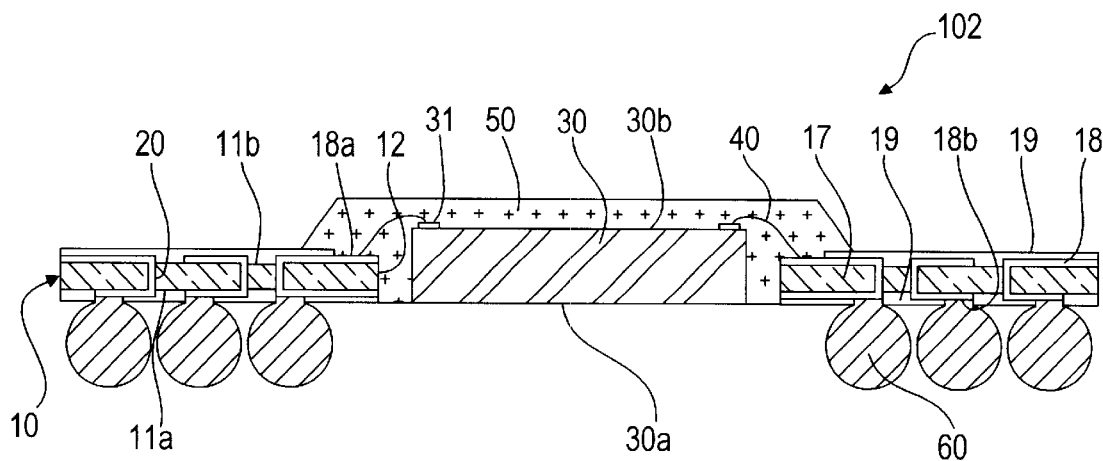
Figure 3:
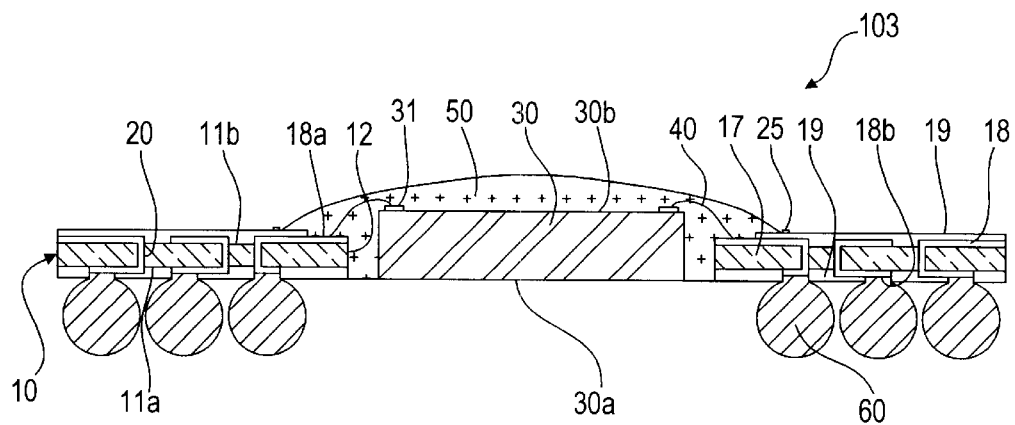

Meanwhile, the semiconductor chip 30 and conductive connecting means 40 are encapsulated by a resin encapsulate 50 so that they are protected from external physical, chemical, and mechanical damage. The resin encapsulate 50 may be formed in such a fashion that it completely encapsulates the entire upper surface of the circuit board 10, as shown in FIG. 1. Where the resin encapsulate 50 completely encapsulates the entire upper surface of the circuit board 10, there is an advantage in that it is possible to prevent the circuit board 10 from being bent. Alternatively, the resin encapsulate 50 may be formed in such a fashion that it partially encapsulates the upper surface of the circuit board 10 at a region where the semiconductor chip 30, connecting means 40, and bond fingers 18a are arranged, as shown in FIG. 2. The resin encapsulate 50 may be formed using an epoxy molding compound so that it is molded using a mold. The use of such a molding compound may be implemented in the case of FIG. 1 or 2. On the other hand, a liquid encapsulating resin may be used to form the resin encapsulate 50. In this case, the encapsulation process may be carried out using a dispenser. The use of such a liquid encapsulating resin may be implemented in the case of FIG. 3. Where the liquid encapsulating resin is used, a dam 25 may be formed on the upper surface of the circuit board 10, as shown in FIG. 3, in order to prevent the liquid encapsulating resin from flowing beyond a desired encapsulating region. In the case of FIG. 1 or 2, the liquid encapsulating resin may also be used. In other words, the present invention is not limited by the material of the resin encapsulate. Semiconductor packages of FIGS. 2 and 3 are denoted by the reference numerals 102 and 103, respectively.

In either case of FIG. 1, 2 or 3, the semiconductor package is formed in such a fashion that the second major surface 30b of the semiconductor chip 30 and the circuit board surface formed with the bond fingers 18a, that is, the second major surface 11b of the circuit board 10, are oriented in the same direction. Also, the first major surface 30a of the semiconductor chip 30, the circuit board surface formed with the ball lands 18b, that is, the first major surface 11a of the circuit board 10, and the lower surface of the resin encapsulate 50 are flush with one another. Accordingly, the semiconductor package has a thin structure. In addition, the first major surface 20a of the semiconductor chip 30 is exposed without being covered with the resin encapsulate 50, so that it can easily discharge heat generated therefrom.

Although not shown, an insulating tape or a copper layer may be attached, as a closure means, to the first major surface 30a of the semiconductor chip 30 in such a fashion that it covers the through hole 12 of the circuit board 10. Where the insulating tape is used as the closure means, it is adapted to protect the first major surface 30a of the semiconductor chip 30 from external damage. On the other hand, where the copper layer is used as the closure means, it is adapted to improve the heat discharge performance of the semiconductor chip 30.

A plurality of conductive balls 60 made of tin (Sn), lead (Pb), or an alloy thereof are fused on the ball lands 18b provided at the first major surface 11a of the resin substrate 17, respectively, in order to allow the semiconductor package to be subsequently mounted on a mother board (not shown).

Figure 4:
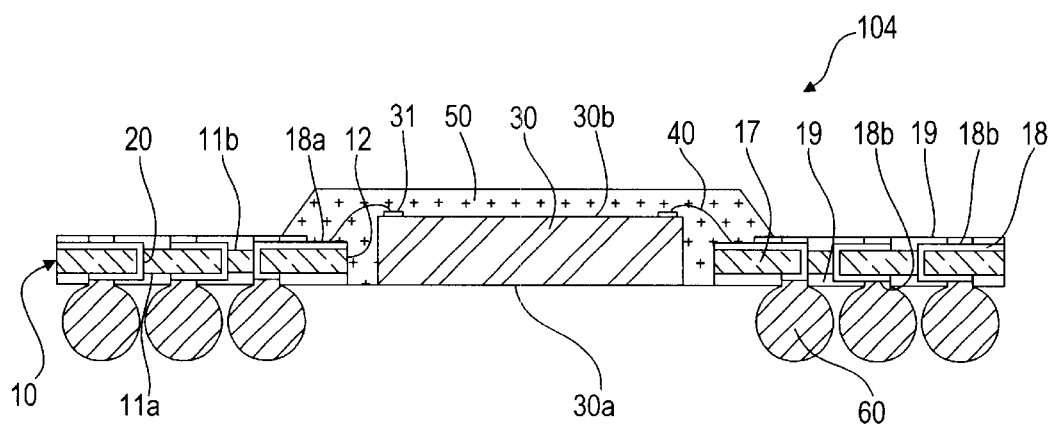
Figure 5:
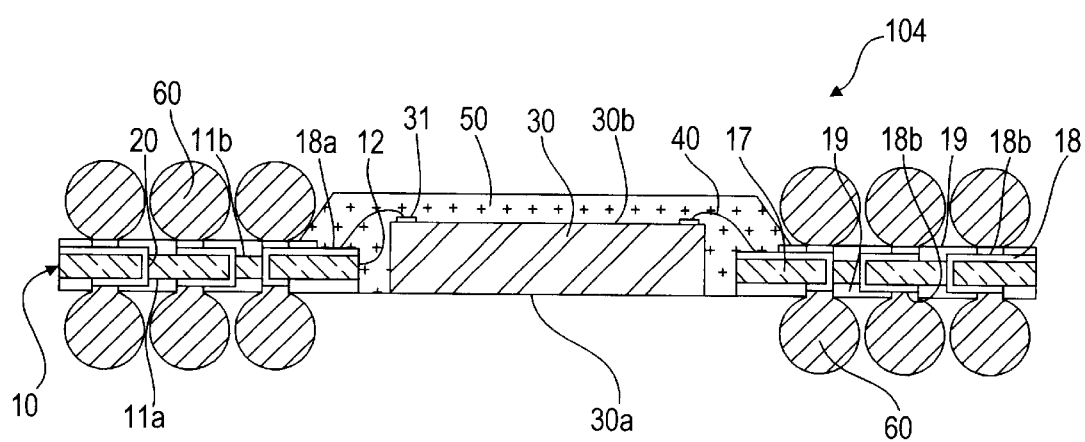

The circuit pattern 18 formed on the second major surface 11b of the resin substrate 17 may also be provided with a plurality of ball lands 18b, as in a semiconductor package 104 illustrated in FIG. 4. As shown in FIG. 4, the ball lands 18b formed on the second major surface 11b of the resin substrate 17 are not covered with the cover coat 19 covering the associated circuit pattern 18 in such a fashion that they are open. This means that a plurality of semiconductor packages having the above mentioned structure can be laminated together. That is, the lamination of a number of semiconductor packages can be achieved under the condition in which a plurality of conductive balls 60 are additionally fused on the ball lands 18b formed at the second major surface 11b of the resin substrate 17 in the semiconductor package 105 of FIG. 5.

Figure 6A:
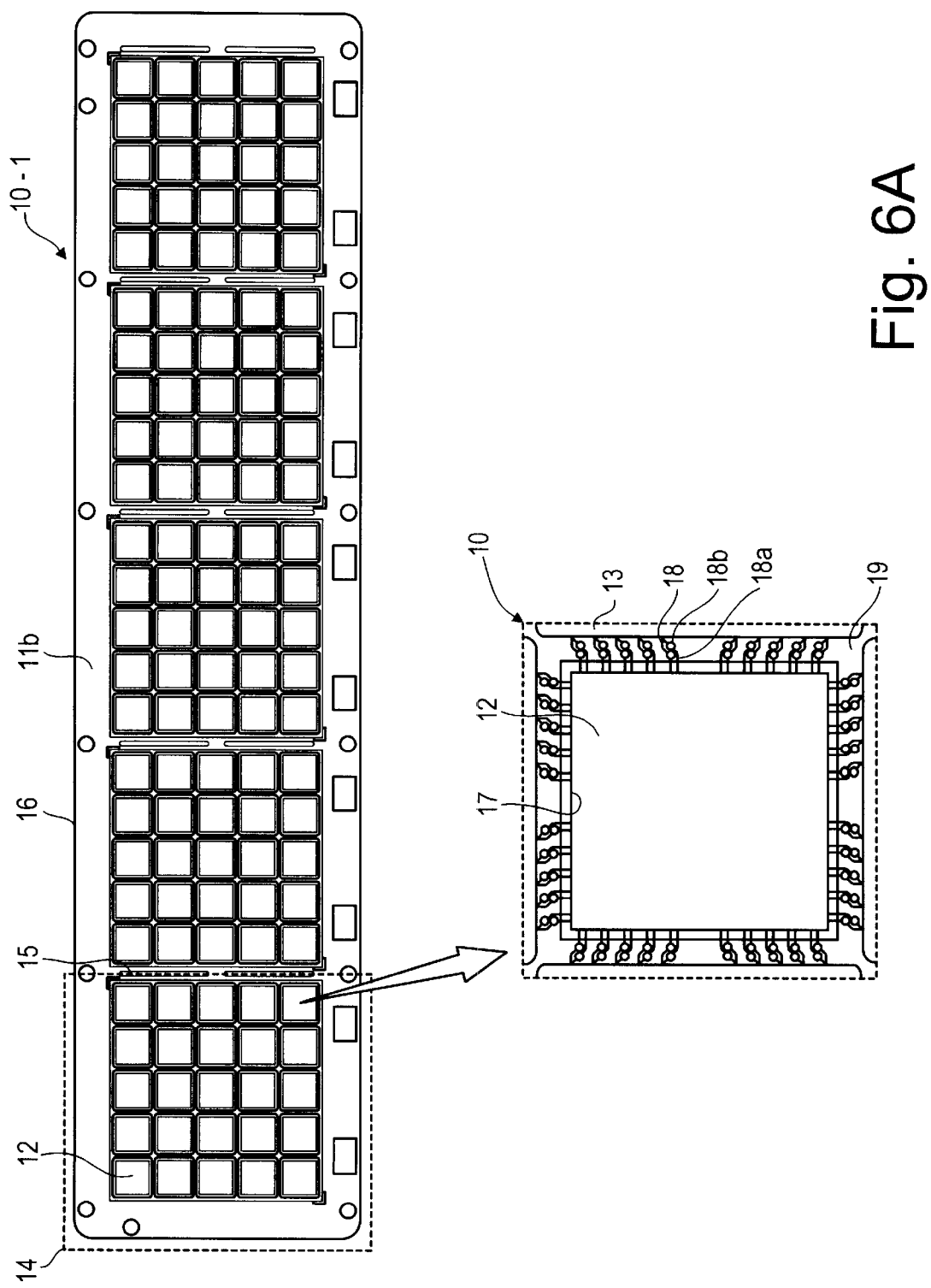
FIGS. 6A and 6B are a top view and a bottom view respectively illustrating an exemplary circuit board strip useful in the fabrication of the semiconductor packages described herein.
Figure 6B:
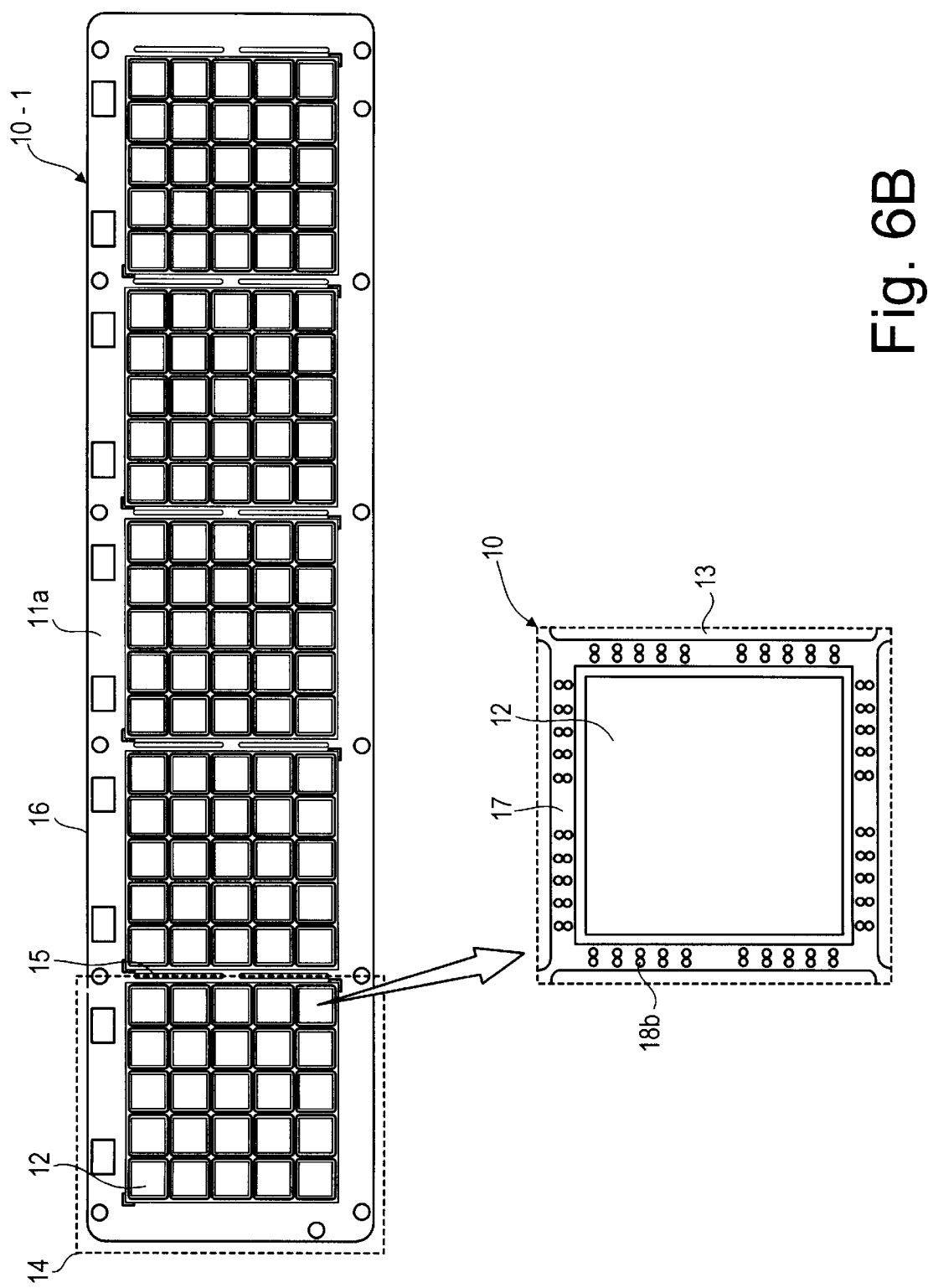

FIGS. 6A and 6B are a top view and a bottom view respectively illustrating a circuit board strip used in the fabrication of the semiconductor package according to the present invention. Now, the structure of the circuit board strip will be described in brief, with reference to FIGS. 6A and 6B. In FIGS. 6A and 6B, elements respectively corresponding to those in FIGS. 1 to 5 are denoted by the same reference numerals.

As shown in FIGS. 6A and 6B, the circuit board strip, which is denoted by the reference numeral 10-1, includes a main strip 16 comprising a resin substrate 17, circuit patterns 18, and cover coats 19. The resin substrate 17 has a substantially rectangular plate structure having a first major surface 11a (FIG. 6B) and a second major surface 11b (FIG. 6A). The main strip 16 is divided into a plurality of sub-strips 14 aligned together in the longitudinal direction of the main strip 16 by a plurality of main slots 15. Main slots 15 extend through resin substrate 17 at a side of each sub-strip 14. Sub-strips 14 extend to a desired length in a direction transverse to the longitudinal direction of the main strip 16 while being uniformly spaced apart from one another in the longitudinal direction of the main strip 16. A plurality of through holes 12, which are adapted to receive semiconductor chips (not shown) therein, respectively, are formed at each sub strip 14 in such a fashion that they are arranged in the form of a matrix array. Each sub strip 14 is divided by sub slots 13 having a desired length into a rectangular matrix of strip portions, each of which corresponds to a unit circuit board 10 of FIGS. 1–5. Each unit circuit board 10 in each sub strip 14 includes an associated one of the through holes 12 provided at the sub strip 14.

The sub slots 13 and main slots 15 are formed through the resin substrate 17.

In each unit circuit board 10 of circuit board strip 10-1, the circuit patterns 18 are formed on the first and second major surfaces 11a and 11b of the resin substrate 17 between the through hole 12 and the sub slots 13. The circuit patterns 18 are typically comprised of a copper thin film.

In each unit circuit board 10, the cover coats 19 are coated over the exposed surfaces of the circuit patterns 18 and resin substrate 17 in order to protect the circuit patterns 18 from the external environment. The cover coats 19 are typically made of a polymeric resin.

One circuit pattern 18 of each unit circuit board is provided with a plurality of bond fingers 18a to be subsequently connected with a semiconductor chip whereas the other circuit pattern 18 of the unit circuit board is provided with a plurality of ball lands 18b on which conductive balls are to be subsequently fused, respectively. The bond fingers 18a and ball lands 18b are externally open through the associated cover coats 19, respectively.

As shown in FIG. 6A, the circuit pattern 18 formed on the second major surface 11b of the resin substrate 17 may have both the bond fingers 18a and the ball lands 18b. Alternatively, the ball lands 18b may be provided only at the first major surface 11a of the resin substrate 17, as shown in FIG. 6B. Each bond finger 18a is electrically connected with a ball land 18b by conductive via (not shown) through resin substrate 17. Although the ball lands 18b have been illustrated as being arranged along two lines, as shown in FIGS. 6A and 6B, they may be arranged along three through five lines. It will be appreciated by those persons skilled in the art that such an arrangement is optional. In other words, the present invention is not limited by the number of lines on which the ball lands 18b are arranged.

FIGS. 7A to 7F illustrate a semiconductor package fabricating method according to the present invention. Now, the fabrication method will be described with reference to FIGS. 7A to 7F.

In accordance with the semiconductor package fabricating method of the present invention, a circuit board strip, which may have the structure of FIG. 6A or 6B, is used in order to achieve a simultaneous fabrication of a number of semiconductor packages. The following description will be made in conjunction with the case in which the circuit board strip of FIG. 6A or 6B is used. For the simplicity of description, the illustration of the sub slots 13 that are along the four edges of each rectangular unit circuit board 10 of strip 10-1 are omitted.

Figure 7A:
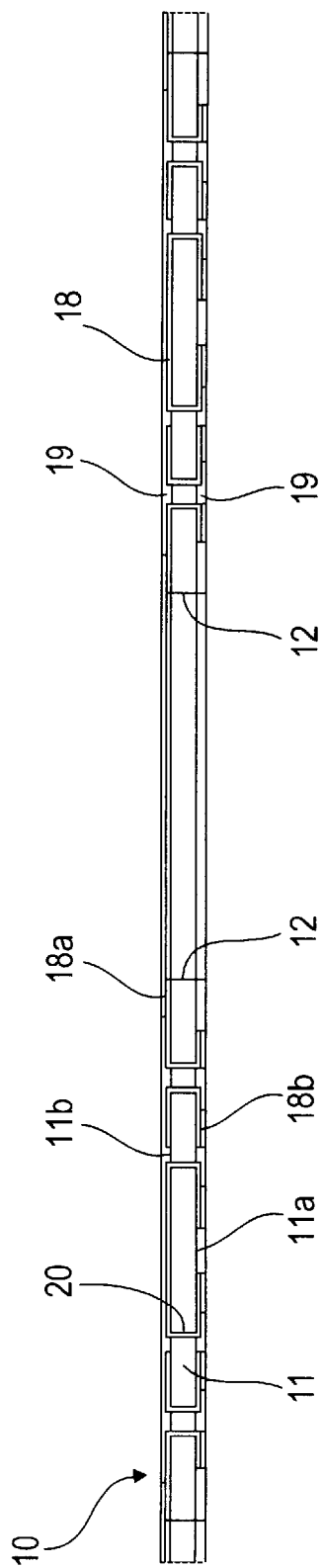

In accordance with the fabricating method of the present invention, a circuit board strip, which is the circuit board strip 10 of FIG. 6A or 6B, is first prepared, as shown in FIG. 7A.

Thereafter, a semiconductor chip 30 is inserted into each of the through holes 12 of the circuit board strip 10, respectively, in such a fashion that the input/output pads 31 of each semiconductor chip 30 are oriented in the same direction as the bond fingers 18a formed on the circuit board strip 10.

Figure 7B:
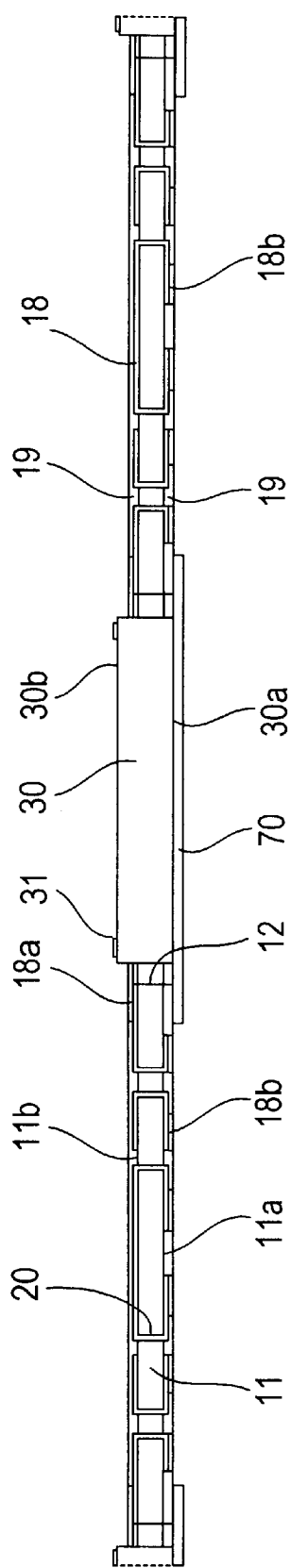

Prior to the insertion of the semiconductor chips 30, closure members 70 are attached to the lower surface of the circuit board strip 10 in such a fashion that each of them covers an associated one of the through holes 12, as shown in FIG. 7B. In this case, each semiconductor chip 30, which is subsequently received in an associated one of the through holes 12, is seated on an associated one of the closure members 70 at the first major surface 30a thereof.

For the closure members 70, insulating tapes may be used. Ultraviolet tapes may be used which can be easily peeled using ultraviolet rays. Alternatively, heat sensitive tapes may be used. For the closure members 70, copper layers exhibiting a superior heat discharge property also may be attached to the circuit board strip 10. In such a case, the closure members 70 are not removed after the completion of the package fabrication.

Alternatively, the closure members 70 may be attached to the circuit board strip 10-1 in such a fashion that they cover the entire lower surface of the circuit board strip 10-1. This will be described in more detail, in conjunction with FIGS. 8A and 8B.

In order to electrically connect the input/output pads 31 of each semiconductor chip 30 with the associated bond fingers 18a of the circuit board strip 10, conductive wires, such as gold wires or aluminum wires, or leads extending from respective bond fingers 18a are then electrically connected, as connection means 40, between the input/output pads 31 and the associated bond fingers 18a, respectively, as shown in FIG. 7C.

Figure 7D:
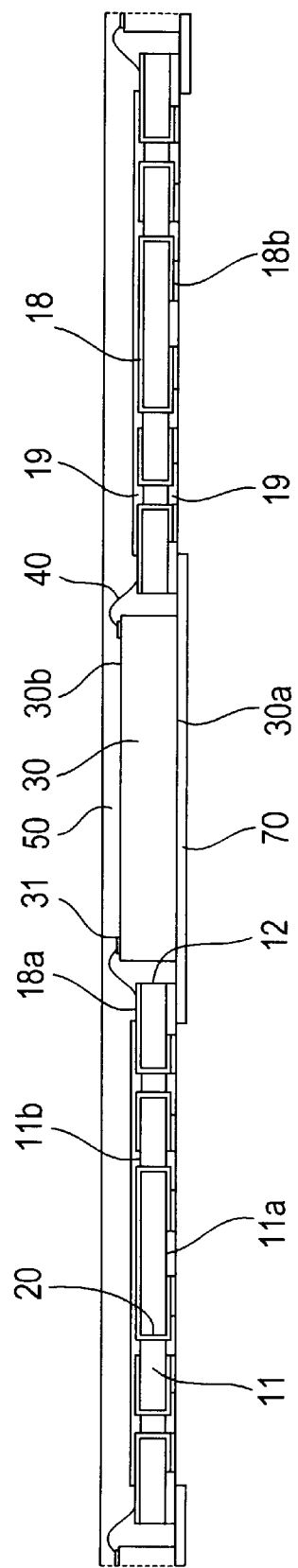

Subsequently, a resin encapsulate 50 is formed using an encapsulating resin, such as an epoxy molding compound or a liquid encapsulating resin, in such a fashion that it encapsulates the entire upper surface of each semiconductor chip 30, the entire upper surface of the circuit board strip 10, and the connection means 40, as shown in FIG. 7D. Alternatively, the resin encapsulate 50 may be formed in such a fashion that it partially encapsulates desired upper surface portions of the circuit board strip 10 while completely encapsulating the upper surface of each semiconductor chip 30 and the connection means 40. The encapsulating extent of the resin encapsulate 50 is optional.

The encapsulating process will be described in more detail, in conjunction with FIG. 9.

Figure 7E:
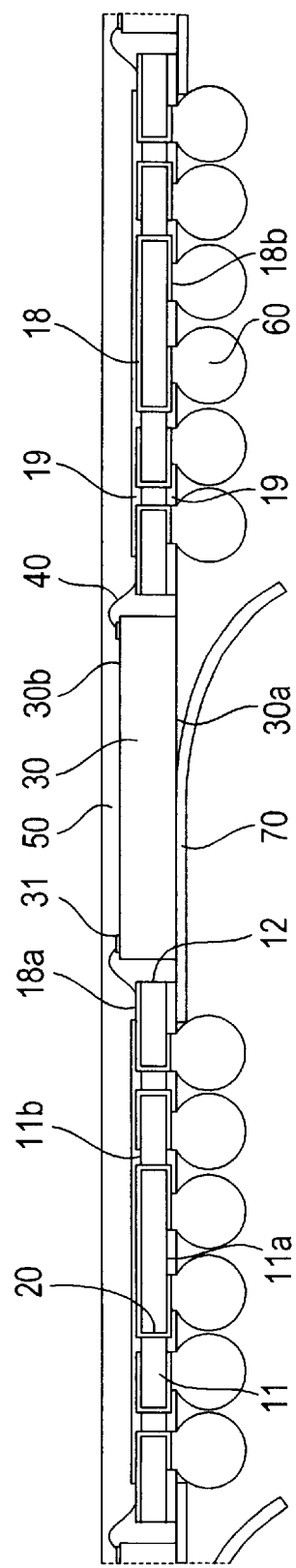

Thereafter, a plurality of conductive balls 60 are fused on the ball lands 18b provided at the lower surface of the circuit board strip 10 in order to allow each unit circuit board of the circuit board strip 10 to be mounted to a mother board in a subsequent process, as shown in FIG. 7E.

In the case in which the circuit board strip 10 is provided with ball lands 18b not only at the lower surface thereof, but also at the upper surface thereof formed with the bond fingers 18a, conductive balls 60 are also fused on the ball lands 18b of that upper surface. In this case, a plurality of semiconductor packages can be laminated together in a subsequent process.

The fusing of the conductive balls 60 may be achieved using a variety of appropriate methods. For example, a screen printing method may be used. In accordance with this screen printing method, a sticky flux exhibiting a high viscosity is first applied, in the shape of dots, to the ball lands 18b. Conductive balls 60 are then temporarily bonded to the flux dots, respectively. The resultant circuit board strip 10 is subsequently put into a furnace so that the conductive balls 60 are fused on the associated ball lands 18b, respectively.

Figure 7F:
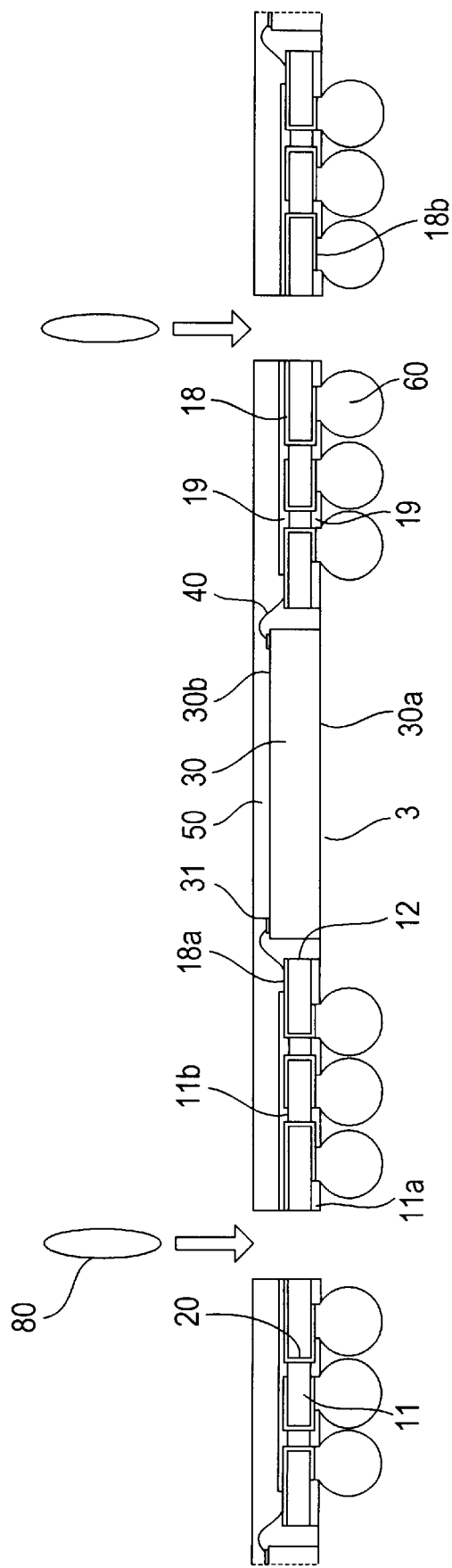

Finally, the circuit board strip 10 is then singulated into individual semiconductor packages, each corresponding to one unit circuit board, using a desired singulation tool 80, as shown in FIG. 7F.

In the singulation process, the singulation tool 80 (e.g., a saw) passes through regions defined between adjacent sub slots (not shown).

Removal of the closure members 70 may be conducted, to externally expose respective first major surfaces 30a of the semiconductor chips 30, before or after a formation of input/output terminals achieved by the fusing of the conductive balls on the ball lands 18b, or after the singulation process. It is also possible to deliver the semiconductor packages in a state in which the closure members 70 are not removed, for example, where the closure member is made of a copper layer.

Where the resin encapsulate 50 is formed to completely encapsulate the entire upper surface of the circuit board strip 10, the singulation processes for the resin encapsulate 50 and the circuit board strip 10 are simultaneously conducted. In this case, semiconductor packages having a structure shown in FIG. 1 are produced.

Figure 8A:
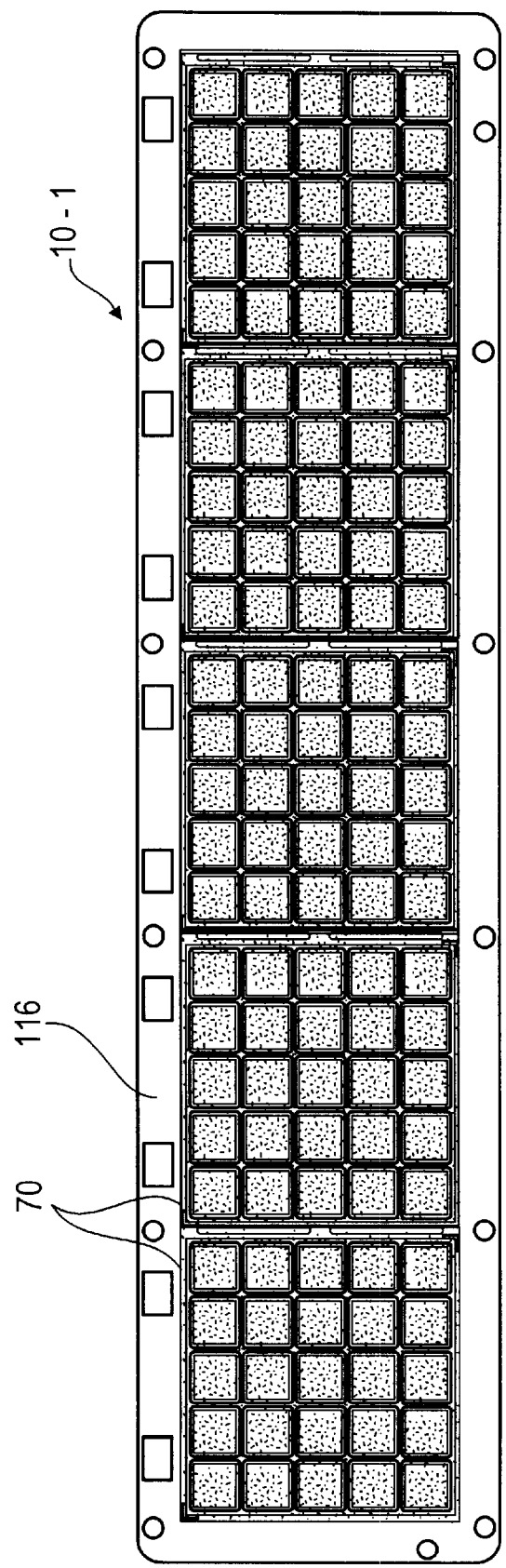
FIGS. 8A and 8B are bottom views each illustrating an alternative method for attaching closure members in the exemplary fabrication method.
Figure 8B:
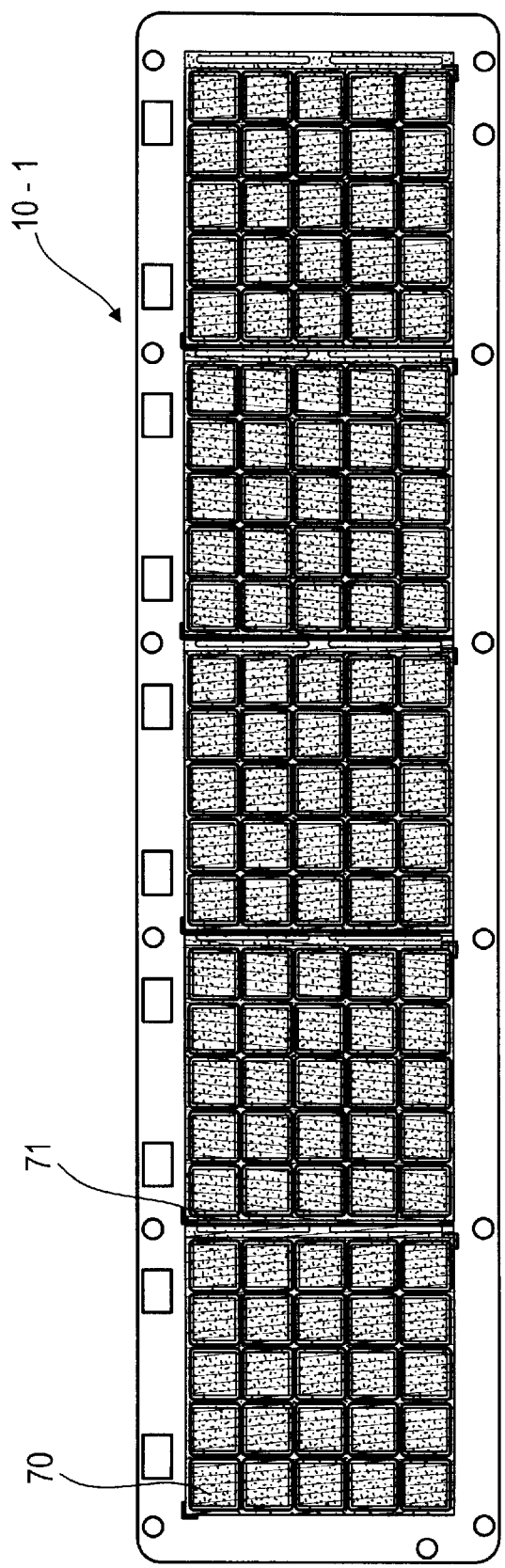

FIGS. 8A and 8B are bottom views each illustrating another attaching method for the closure members usable in the semiconductor package fabricating method according to the present invention.

In accordance with the attaching method of FIG. 8A, a plurality of closure member strips are used, each of which provides in interconnected form the closure member 70 for each unit circuit board 10 of one sub strip 14 of the circuit board strip 10-1. That is, the closure member strips are individually attached to the sub-strips 14 of the circuit board strip 10-1. In this case, it is preferred that each closure member strip be arranged in such a fashion that it covers the main slot 15 formed at one side of the sub strip covered therewith.

The reason why each closure member strip has the above mentioned arrangement is to achieve an easy removal of the closure members 70. That is, the closure members 70 of each closure member strip can be easily detached from the associated sub strip 14 of the circuit board strip 10-1 by inserting a planar bar (not shown) into the main slot 15 formed at one side of the sub strip 14, thereby pushing the closure member strip in such a fashion that it is detached from the sub strip 14. At this time, the planar bar moves in a direction from the second major surface 11b of the circuit board strip 10-1 to the first major surface 11a.

In accordance with the attaching method of FIG. 8B, a single closure member strip is used which provides in interconnected form a closure member 70 for each unit circuit board 10 of all sub-strips 14 of the circuit board strip 10-1 having small singulation apertures or slits 71 at a region corresponding to each main slot 15 of the circuit board strip 10-1. In this case, the closure members 70 for all sub-strips 14 are simultaneously attached to those sub-strips 14.

Similar to the case of FIG. 8A, the reason why the closure member strip has the above mentioned arrangement in the case of FIG. 8B is to achieve an easy removal of the closure members 70. That is, the closure members 70 of the closure member strip can be easily detached from the circuit board strip 10 by inserting a planar bar (not shown) into each main slot 15 of the circuit board strip 10, thereby pushing the closure member strip, in particular, the portion thereof formed with the singulation apertures 71, in such a fashion that it is detached from the circuit board strip 10. In this case, the closure member strip utilizes an easy singulation configuration, applied to the technical field of postage-stamps, using small singulation apertures.

Figure 9:
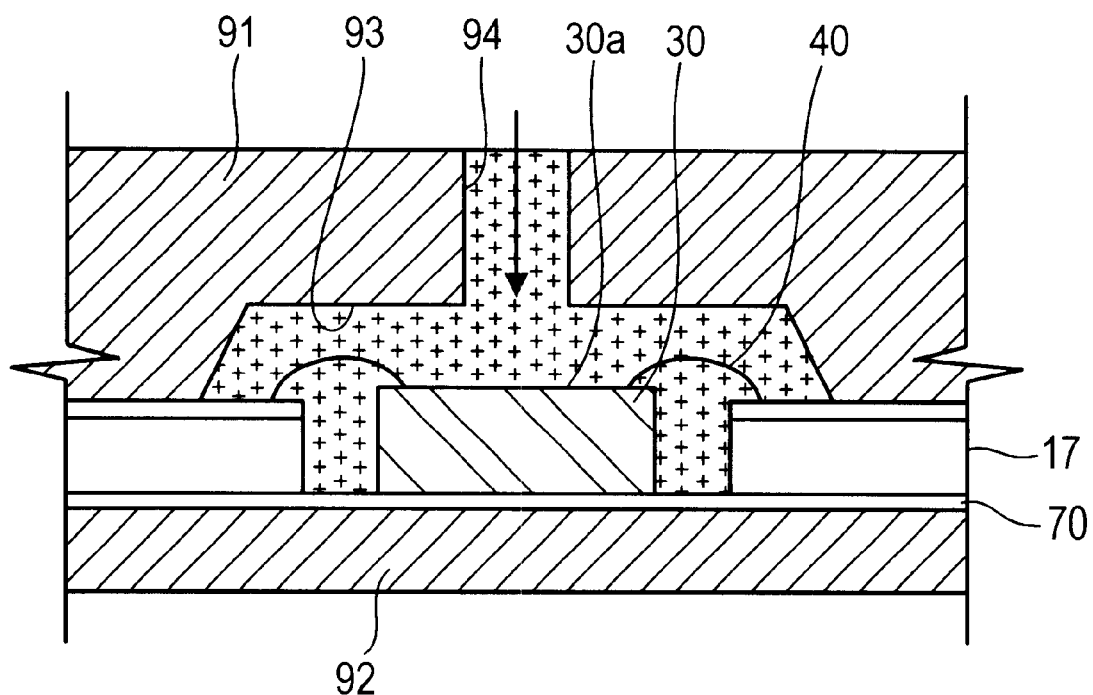
FIG. 9 is a cross-sectional view illustrating an encapsulating method usable in the exemplary fabrication method described.
Figure 10:
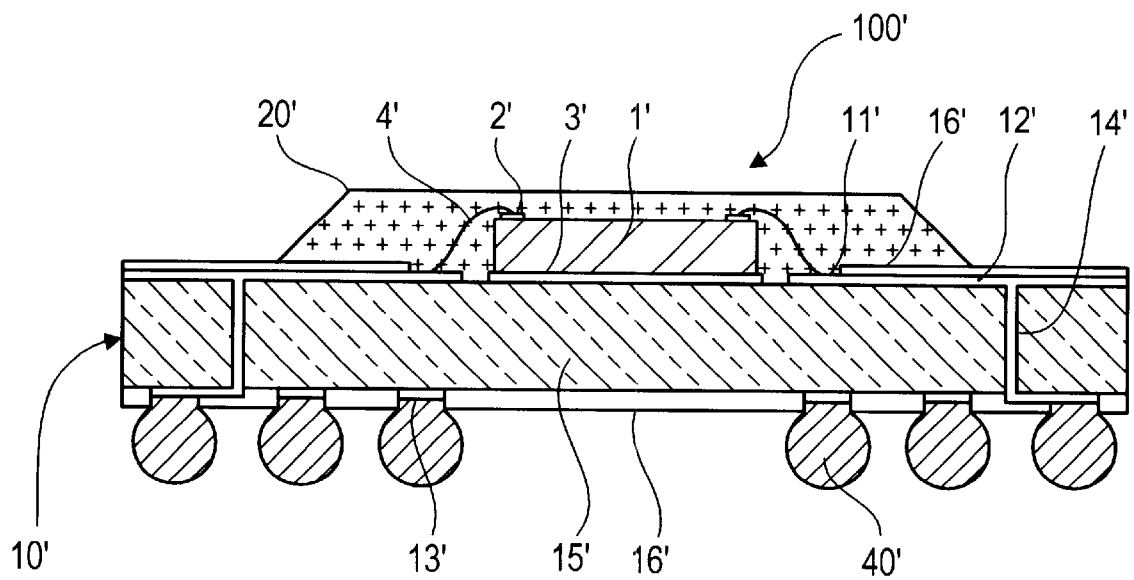
FIG. 10 is a cross-sectional view illustrating a typical BGA semiconductor package having a conventional structure.

FIG. 9 illustrates an encapsulating method usable in the semiconductor package fabricating method according to the present invention.

In accordance with the encapsulating method shown in FIG. 9, a mold is used which includes an upper mold 91 having cavities 93 and gates 94, and a lower mold 92. First, the circuit board strip 10 is interposed between the upper and lower molds 91 and 92 in such a fashion that the second major surface 30a of each semiconductor chip 30 faces an associated one of the cavities 93 while facing an associated one of the gates 94 at the central portion thereof.

An encapsulating resin is then injected into each cavity 93 of the upper mold 91 through an associated one of the gates 94 in such a fashion that it flows outwardly from the central portion of the second major surface 30a of each semiconductor chip 30 along the second major surface 30a. Thus, each semiconductor chip 30 is encapsulated. In accordance with this encapsulating method, it is possible to minimize a wire sweeping phenomenon occurring during the encapsulating process, as compared to conventional encapsulating methods in which the encapsulation proceeds from one side of the circuit board. The reason why a minimized wire sweeping phenomenon occurs in accordance with the present invention is because a maximum pressure of the encapsulating resin is applied to the central portion of the second major surface of each semiconductor chip while being gradually reduced toward the peripheral portion of the second major surface where wires are arranged.

As apparent from the above description, in accordance with the present invention, a circuit board is used which has a through hole of a desired size adapted to receive a semiconductor chip, thereby allowing the thickness of the semiconductor chip to be offset by the thickness of the circuit board. Accordingly, it is possible to fabricate semiconductor packages having a super-thin structure.

In accordance with the present invention, the semiconductor chip is outwardly exposed at one major surface thereof without being encapsulated by an encapsulate. Accordingly, heat generated from the semiconductor chip can be easily discharged into the atmosphere. This results in an improvement in the thermal and electrical performance of the semiconductor chip.

In accordance with the present invention, the circuit board may be completely encapsulated at one major surface thereof by an encapsulate. In this case, it is possible to effectively prevent a bending phenomenon of the circuit board.

In addition, the use of closure members during the fabrication of semiconductor packages according to the present invention achieves an easy encapsulating process. For such closure members, closure member strips may be used, each of which has closure members for one sub strip of a circuit board strip. In this case, the closure member strips are individually attached to the sub-strips of the circuit board strip. Alternatively, a single closure member strip may be used which has closure members for all sub-strips of the circuit board strip while having small singulation apertures or slits. By virtue of such a single closure member strip or closure member strips, an easy removal of closure members is achieved.

Also, the encapsulating process involved in the fabrication of semiconductor packages is conducted in such a fashion that it proceeds from the second major surface of each semiconductor chip in accordance with the present invention. Accordingly, it is possible to achieve a uniform encapsulation while suppressing the occurrence of a wire sweeping phenomenon.

Other embodiments of semiconductor packages and methods of making them are disclosed in U.S. patent application Ser. No. 09/566,069, which was filed with the U.S. Patent and Trademark Office on May 5, 2000, and in U.S. patent application Ser. No. 09/574,006, which was filed on the same day as the present application. Both of these applications are incorporated herein by reference in their entireties.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating semiconductor packages, the method comprising:

providing a circuit board strip including a plurality of unit circuit boards, each unit circuit board having a plurality of first ball lands formed at a first major surface thereof, a plurality of bond fingers formed at an opposite second major surface thereof, vias through the circuit board each electrically connected between a bond finger and a first ball land, and a through hole between the first and second major surfaces;

receiving in each through hole a semiconductor chip having a first major surface, and an opposite second major surface provided with a plurality of input/output pads thereon, wherein the second major surface of the chip faces in the same direction as the first major surface of the respective circuit board;

electrically connecting the input/output pads of each semiconductor chip with associated ones of the bond fingers of the respective circuit board;

encapsulating the semiconductor chips, and filling the through hole of each unit circuit board of the circuit board strip using an encapsulating material;

fusing conductive balls on the first ball lands of each unit circuit board;

singulating the circuit board strip into semiconductor packages respectively corresponding to the unit circuit boards.

2. The method of claim 1, wherein the circuit board strip comprises:

a main strip including a resin substrate having a substantially rectangular strip shape, a first major surface and a second major surface;

a plurality of main slots extending to a desired length in a direction transverse to a longitudinal direction of the main strip while being uniformly spaced apart from one another in the longitudinal direction of the main strip, thereby dividing the main strip into a plurality of sub-strips aligned together in the longitudinal direction of the main strip;

a plurality of sub slots extending to a desired length and serving to divide each of the sub-strips into a plurality of strip portions arranged in a matrix array, each of the strip portions corresponding to one of the unit circuit boards having one of the through holes;

a plurality of first circuit patterns each formed on the first major surface of the resin substrate for an associated one of the strip portions and provided with associated ones of the first ball lands;

a plurality of second circuit patterns each formed on the second major surface of the resin substrate for an associated one of the strip portions and provided with associated ones of the bond fingers; and cover coats respectively coated over the first and second major surfaces of the resin substrate while allowing the bond fingers and the ball lands to be exposed therethrough.

3. The method of claim 1, wherein the circuit board strip comprises:

a resin substrate having a substantially rectangular strip shape provided with a first major surface and a second major surface;

a plurality of slots extending to a desired length and serving to divide each of the resin substrate into a plurality of substrate portions arranged in a matrix array, each of the substrate portions corresponding to one of the unit circuit boards having one of the through holes;

a plurality of first circuit patterns each formed on the first major surface of the resin substrate for an associated one of the strip portions and provided with associated ones of the first ball lands;

a plurality of second circuit patterns each formed on the second major surface of the resin substrate for an associated one of the strip portions and provided with associated ones of the bond fingers; and cover coats respectively coated over the first and second major surfaces of the resin substrate while allowing the bond fingers and the ball lands to be exposed therethrough.

4. The method of claim 1, further comprising attaching one or more closure members to the first surface of the substrate strip so that each through hole is covered thereby prior to receiving the semiconductor chip in the respective through hole.

5. The method of claim 2, further comprising:

attaching a plurality of closure members to the first major surface of the circuit board strip in such a fashion that the closure members simultaneously cover associated ones of the through holes, prior to the step of receiving the semiconductor chips in the through holes.

6. The method according to claim 3, further comprising the step of:

attaching a plurality of closure members to the first major surface of the circuit board strip in such a fashion that the closure members simultaneously cover associated ones of the through holes, prior to the step of receiving the semiconductor chips in the through holes.

7. The method according to claim 5, wherein attaching the closure member comprises:

preparing closure member strips each having closure members for an associated one of the sub-strips; and individually attaching the closure member strips to the sub-strips, respectively, in such a fashion that each of the closure member strips is arranged to cover the main slot formed at one side of an associated one of the sub-strips.

8. The method according to claim 5, wherein attaching the closure member comprises:

preparing a single closure member strip having closure members for all sub-strips of the circuit board strip while having small singulation apertures at a region corresponding to each of the main slots; and attaching the closure member strip to the main strip in such a fashion that the closure member strip is arranged to allow each of the small singulation apertures to be aligned with an associated one of the main slots.

9. The method of claim 4, wherein the one or more closure members are removed after encapsulating the semiconductor chips.

10. The method of claim 5, wherein the closure members are removed after encapsulating the semiconductor chips.

11. The method of claim 6, wherein the closure members are removed after encapsulating the semiconductor chips.

12. The method of claim 7, wherein the closure members are removed after encapsulating the semiconductor chips by inserting a bar into one or more of the main slots in a direction from the second major surface of the circuit board strip to the first major surface of the second board strip, thereby detaching an associated one of the closure members from the circuit board strip at one side of the associated closure member.

13. The method of claim 8, wherein the closure members are removed after encapsulating the semiconductor chips by inserting a bar into one or more of the main slots in a direction from the second major surface of the circuit board strip to the first major surface of the second board strip, thereby detaching an associated one of the closure members from the circuit board strip at one side of the associated closure member.

14. The method of to claim 4, wherein each closure member is selected from the group consisting of an insulating tape, an ultraviolet tape, and a copper layer.

15. The method of claim 5, wherein each of the closure members is selected from the group consisting of an insulating tape, an ultraviolet tape, and a copper layer.

16. The method of claim 6, wherein each of the closure members is selected from the group consisting of an insulating tape, an ultraviolet tape, and a copper layer.

17. The method of claim 4, wherein a unitary body of encapsulant material covers the second major surface of all of the unit circuit boards of the circuit board strip.

18. The method according to claim 5, wherein a unitary body of encapsulant material covers the second major surface of all of the unit circuit boards of the circuit board strip.

19. The method according to claim 6, wherein a unitary body of encapsulant material covers the second major surface of all of the unit circuit boards of the circuit board strip.

20. The method according to claim 17, wherein singulating the circuit board strip is carried out in such a fashion that the encapsulant material and the circuit board strip are simultaneously split.

21. The method according to claim 18, wherein singulating the circuit board strip is carried out in such a fashion that the encapsulant material and the circuit board strip are simultaneously split.

22. The method according to claim 19, wherein singulating the circuit board strip is carried out in such a fashion that the encapsulant material and the circuit board strip are simultaneously split.

23. The method of claim 1, wherein encapsulating the circuit board strip comprises:
   interposing the circuit board strip between a pair of mold dies, one of which has cavities and gates, in such a fashion that the second major surface of each of the semiconductor chips faces an associated cavity and a gate into the cavity; and
   injecting the encapsulating material into each of the cavities through the associated gate in such a fashion that it flows outwardly from a central portion of the second major surface of the associated semiconductor chip along the second major surface.

24. The method of claim 2, wherein the encapsulating the circuit board strip comprises:
   interposing the circuit board strip between a pair of mold dies, one of which has cavities and gates, in such a fashion that the second major surface of each of the semiconductor chips faces an associated cavity and a gate into the cavity; and
   injecting the encapsulating material into each of the cavities through the associated gate in such a fashion that it flows outwardly from a central portion of the second major surface of the associated semiconductor chip along the second major surface.

25. The method of claim 4, wherein the encapsulating the circuit board strip comprises:
   interposing the circuit board strip between a pair of mold dies, one of which has cavities and gates, in such a fashion that the second major surface of each of the semiconductor chips faces an associated cavity and a gate into the cavity; and
   injecting the encapsulating material into each of the cavities through the associated gate in such a fashion that it flows outwardly from a central portion of the second major surface of the associated semiconductor chip along the second major surface, fills the through hole, and contacts the closure member.

26. The method of claim 9, wherein the encapsulating the circuit board strip comprises:
   interposing the circuit board strip between a pair of mold dies, one of which has cavities and gates, in such a fashion that the second major surface of each of the semiconductor chips faces an associated cavity and a gate into the cavity; and
   injecting the encapsulating material into each of the cavities through the associated gate in such a fashion that it flows outwardly from a central portion of the second major surface of the associated semiconductor chip along the second major surface, fills the through hole, and contacts the closure member.

27. The method of claim 1, wherein each unit circuit board of the circuit board strip is further provided with a plurality of second ball lands at the second major surface thereof.

28. The method of claim 2, wherein each unit circuit board of the circuit board strip is further provided with a plurality of second ball lands at the second major surface thereof.

29. The method of claim 3, wherein each unit circuit board of the circuit board strip is further provided with a plurality of second ball lands at the second major surface thereof.

30. The method of claim 27, further comprising fusing a plurality of conductive balls on the second ball lands.

31. The method of claim 28, further comprising fusing a plurality of conductive balls on the second ball lands.

32. The method of claim 29, further comprising fusing a plurality of conductive balls on the second ball lands.

33. The method of claim 4, wherein each unit circuit board of the circuit board strip is further provided with a plurality of second ball lands at the second major surface thereof.

34. The method of claim 33, wherein the one or more closure members are removed after encapsulating the semiconductor chips.

35. The method of claim 34, further comprising fusing a plurality of conductive balls on the second ball lands.

* * * * *